(12) United States Patent
Kiyokawa et al.

(10) Patent No.: US 7,393,885 B2
(45) Date of Patent: Jul. 1, 2008

(54) PHOSPHORUS-CONTAINING COATED MAGNESIUM OXIDE POWDER, METHOD FOR PRODUCING SAME, AND RESIN COMPOSITION CONTAINING SUCH POWDER

(75) Inventors: Toshio Kiyokawa, Hyogo (JP); Kaori Yamamoto, Hyogo (JP); Masaaki Kunishige, Hyogo (JP)

(73) Assignee: Tateho Chemical Industries Co., Ltd. (JP)

( * ) Notice: Subject to any disclaimer, the term of this patent is extended or adjusted under 35 U.S.C. 154(b) by 232 days.

(21) Appl. No.: 10/597,007

(22) PCT Filed: Dec. 1, 2005

(86) PCT No.: PCT/JP2005/022051

§ 371 (c)(1),
(2), (4) Date: Jul. 6, 2006

(87) PCT Pub. No.: WO2006/059666

PCT Pub. Date: Jun. 8, 2006

(65) Prior Publication Data

US 2007/0184269 A1 Aug. 9, 2007

(30) Foreign Application Priority Data

Dec. 1, 2004 (JP) .............................. 2004-348464

(51) Int. Cl.
*C08K 9/10* (2006.01)
*C08K 9/00* (2006.01)
*C08K 3/32* (2006.01)
*C08K 3/22* (2006.01)
*B32B 9/04* (2006.01)

(52) U.S. Cl. ....................... 523/210; 523/200; 524/436; 524/417; 524/414; 428/403; 428/404

(58) Field of Classification Search ......... 523/200–217; 524/414–417, 436; 428/357–407
See application file for complete search history.

(56) References Cited

U.S. PATENT DOCUMENTS

| 5,543,444 A * | 8/1996 | Kobayashi et al. .......... 523/205 |
| 7,045,561 B2 * | 5/2006 | Kinose et al. ............... 523/205 |
| 2004/0063815 A1 * | 4/2004 | Kinose et al. ............... 523/205 |

FOREIGN PATENT DOCUMENTS

| JP | 1-320219 A | 12/1989 |
| JP | 2001-115057 A | 4/2001 |
| JP | 2003-34523 A | 2/2003 |
| JP | 2004-27177 A | 1/2004 |
| WO | 2001-010958 | 2/2001 |

* cited by examiner

*Primary Examiner*—D. Lawrence Tarazano
*Assistant Examiner*—James W Taylor, II
(74) *Attorney, Agent, or Firm*—Lucas & Mercanti, LLP

(57) ABSTRACT

A phosphorus-containing coated magnesium oxide powdered material comprising a coated magnesium oxide powdered material having a surface coating layer comprised of a double oxide, wherein the phosphorus-containing coated magnesium oxide powdered material has a coating layer comprised of a magnesium phosphate compound in at least part of a surface of the coated magnesium oxide powdered material, wherein the content of the magnesium phosphate compound in the coated magnesium oxide powdered material is 0.1 to 10% by mass, in terms of phosphorus; a method for producing a phosphorus-containing coated magnesium oxide powdered material, wherein the method comprises treating a coated magnesium oxide powdered material having a surface coating layer comprised of a double oxide with a phosphorus compound, and then calcining the resultant powdered material at 300° C. or higher to form a magnesium phosphate compound in at least a part of a surface of the coated magnesium oxide powdered material; and a resin composition comprising the powder.

13 Claims, No Drawings

PHOSPHORUS-CONTAINING COATED MAGNESIUM OXIDE POWDER, METHOD FOR PRODUCING SAME, AND RESIN COMPOSITION CONTAINING SUCH POWDER

FIELD OF THE INVENTION

The present invention relates to a phosphorus-containing coated magnesium oxide powdered material having excellent water resistance. More particularly, the present invention is concerned with a phosphorus-containing coated magnesium oxide powdered material which exhibits extremely excellent water resistance when used as a filler material into a resin and the like as a radiator, a method for producing the same, and a resin composition comprising the powder.

BACKGROUND OF THE INVENTION

An electronic device is comprised of electronic parts, such as laminates, printed wiring boards, and multilayer wiring boards. In the electronic parts, generally, a resin composition is used as a prepreg, a spacer, a sealer, an adhesive sheet, or the like, and the resin composition is required to have various performance or properties. For example, recently, as the capacity and density of power elements mounted on the electronic device are increasing, the resin composition and parts using the resin composition must have even more excellent heat radiating properties and water resistance than those of conventional ones.

On the other hand, high-performance plastics used in industrial applications, e.g., electric devices, electronic devices, automobiles, and OA machines are called engineering plastics and generally have a heat resistance of 100° C. or higher and excellent mechanical properties.

Conventionally, metals, typically die-casted aluminum and die-casted zinc have been used in the applications of optical parts, electric and electronic parts, and automobile parts. However, processing such metals into predetermined shapes costs much and therefore, recently, thermoplastic resins including the above engineering plastics are being used as substitutes for the metals. The resins used in these applications are required to achieve rigidity and dimensional stability as high as those of metals, therefore a molding material is used in the form of a resin composition containing a large amount of fibrous, plate-form, or particulate inorganic filler in the resin for improving the above properties. Such a resin composition has to be improved in especially heat radiating properties in addition to the rigidity and dimensional stability.

As filler for use in a semiconductor sealing resin composition, silicon dioxide (hereinafter, referred to as "silica") and aluminum oxide (hereinafter, referred to as "alumina") have conventionally been used. Silica has, however, poor thermal conduction properties, and a resin composition using silica as filler does not have satisfactory heat radiation to deal with the increased heat generation due to the increase of integration degree, power, or speed of a semiconductor device, causing problems in the stable operation of semiconductor. On the other hand, a resin composition using as filler alumina having higher thermal conduction properties than those of silica has improved heat radiating properties, but the alumina has high hardness and causes a problem of the production process in that a kneading machine, a molding machine, and a mold markedly wear.

For solving the problems, magnesium oxide (MgO) having a thermal conductivity higher than that of silica by single digit and equivalent to that of alumina is studied as a resin filler material for semiconductor sealing. However, MgO powder has large moisture absorption, as compared to silica powder, and therefore, when the MgO powder is used as resin filler for semiconductor sealing, absorbed water and MgO undergo hydration to cause volume expansion of the filler, leading to problems in that cracks are caused in the resin composition and that the thermal conduction properties deteriorate. Thus, for securing a long-term stable operation of semiconductor, it is an important task to impart a water resistance to the MgO powder for use in resin filler for semiconductor sealing.

For achieving the task, there has been proposed MgO powder having high acid resistance and high water resistance obtained by, for example, subjecting MgO powder to surface treatment with an acid phosphate having a $C_4$-$C_{30}$ alkyl group or a $C_4$-$C_{30}$ alkenyl group, such as $C_{17}$ stearyl acid phosphate, to form a coating film of an acid phosphate compound (Patent document 1).

However, the surface treatment with an acid phosphate improves the water resistance to an extent such that water repellency is imparted to the MgO powder due to, e.g., a $C_{17}$ stearyl group, and the water resistance of the MgO powder itself is improved to some extent, but the improvement is not satisfactory.

As another method of improving the water resistance of the MgO powder, there has been proposed a method for producing coated MgO powder, which comprises mixing an aluminum (Al) salt or a silicon (Si) compound with MgO powder, and removing solids from the resultant mixture by filtration, and drying and calcining it to coat the surface of the MgO powder with a coating layer comprised of a double oxide of Al or Si and Mg (see Patent documents 2 and 3).

The above method is not merely a surface treatment but coating with a double oxide obtained by reacting Al or Si on the surface of the MgO powder, and therefore the resultant coated MgO powder is considerably improved in the water resistance.

However, it is difficult to completely coat the surface with the double oxide, and a region in which the double oxide does not completely cover remains on the surface of the MgO powder and a hydration reaction proceeds in that region, thus making it difficult to meet the strict requirements of water resistance demanded in recent years.

[Patent document 1] Japanese Unexamined Patent Publication No. 2001-115057
[Patent document 2] Japanese Unexamined Patent Publication No. 2003-34522
[Patent document 3] Japanese Unexamined Patent Publication No. 2003-34523

DISCLOSURE OF THE INVENTION

Problems to be Solved by the Invention

It is an object of the present invention to solve the above problems and provide a coated MgO powdered material having excellent water resistance and a method for producing the same, and to provide a resin composition having excellent water resistance comprising the coated MgO powdered material.

Means to Solve the Problems

The present inventors have conducted extensive and intensive studies with a view toward attaining the above object, and, for making up for the incomplete region of the coating comprised of a double oxide on the MgO powdered material surface to improve the water resistance, they have made an attempt to form another coating layer comprised of a magnesium phosphate compound on the coating layer comprised of a double oxide.

Specifically, in the present invention, there is provided a phosphorus-containing coated magnesium oxide powdered material comprising a coated magnesium oxide powdered material having a surface coating layer comprised of a double oxide, wherein the phosphorus-containing coated magnesium oxide powdered material has a coating layer comprised of a magnesium phosphate compound on at least a part of a surface of the coated magnesium oxide powdered material, wherein the content of the magnesium phosphate compound in the coated magnesium oxide powdered material is 0.1 to 10% by mass, in terms of phosphorus.

Further, in the present invention, there is provided a method for producing a phosphorus-containing coated magnesium oxide powdered material, wherein the method comprises treating a coated magnesium oxide powdered material having a surface coating layer comprised of a double oxide with a phosphorus compound, and then calcining the resultant powdered material at 300° C. or higher to form a magnesium phosphate compound on at least a part of a surface of the coated magnesium oxide powdered material.

BEST MODE FOR CARRYING OUT THE INVENTION

The phosphorus-containing coated MgO powdered material of the present invention comprises a coated MgO powdered material having a surface coating layer comprised of a double oxide, and has a coating layer comprised of a magnesium phosphate compound on at least a part of a surface of the coated MgO powdered material.

The coated MgO powdered material, which is a starting material for the phosphorus-containing coated MgO powdered material of the present invention, has a surface coated with a double oxide. It is preferred that the double oxide coating the surface of the MgO powdered material specifically comprises at least one element selected from the group consisting of aluminum, iron, silicon, and titanium, and magnesium. Coating the surface of the MgO powdered material with the double oxide considerably improves the water resistance of the MgO powdered material.

Specific examples of double oxides include forsterite ($Mg_2SiO_4$), spinel ($Al_2MgO_4$), magnesium ferrite ($Fe_2MgO_4$), and magnesium titanate ($MgTiO_3$). Especially preferred is forsterite.

The amount of the double oxide used in the present invention, that is, the amount of the double oxide present in the surface per particle is preferably 5 to 50% by mass, more preferably 10 to 40% by mass. When the amount of the double oxide is in the above range, the surface of the MgO powdered material is coated with the double oxide to considerably improve the water resistance, and further the resin composition containing the resultant powdered material has higher thermal conductivity, and hence the powdered material can exhibit an satisfactory effect when used as thermal conductive filler in, for example, a radiator.

The coated MgO powdered material preferably has an average particle size of $5 \times 10^{-6}$ to $500 \times 10^{-6}$ m, more preferably $10 \times 10^{-6}$ to $100 \times 10^{-6}$ m. The coated MgO powdered material preferably has a BET specific surface area of $5.0 \times 10^3$ $m^2/kg$ or less, more preferably $1.0 \times 10^3$ $m^2/kg$ or less.

The phosphorus-containing coated MgO powdered material of the present invention has a characteristic feature such that it has a coating layer comprised of a magnesium phosphate compound on at least a part of the surface of the double oxide-coated MgO powdered material.

The magnesium phosphate compound is, as described below, formed by reacting a phosphorus compound as a surface treatment agent with Mg on the surface of the MgO powdered material, and, specifically, is preferably represented by, for example, $Mg_xP_yO_z$ (wherein x=1 to 3, y=2, and z=6 to 8).

In this case, the magnesium phosphate compound formed on the surface of the coated MgO powdered material comprised of a double oxide, such as forsterite, possibly contains, in addition to Mg, one or more elements, e.g., silicon (Si), aluminum (Al), iron (Fe), or titanium (Ti).

By virtue of having a coating layer comprised of the magnesium phosphate compound, the phosphorus-containing coated MgO powdered material of the present invention can exhibit considerably high water resistance, as compared to conventional coated MgO powder. For obtaining a satisfactory water resistance, the content of the magnesium phosphate compound in the coated MgO powdered material is 0.1 to 10% by mass, preferably 0.2 to 5% by mass, further preferably 0.2 to 3% by mass, in terms of phosphorus.

It is necessary that the coating layer comprised of the magnesium phosphate compound is formed on at least a part of the surface of the double oxide-coated MgO powdered material, namely, a region of the surface of the double oxide-coated MgO powdered material in which the coating layer comprised of the double oxide is not formed or the coating layer comprised of the double oxide is relatively sparse. However, in practice, it is preferred that the coating layer comprised of the magnesium phosphate compound is formed to cover the whole surface of the double oxide-coated MgO powdered material.

The resin composition of the present invention comprises the above-described phosphorus-containing coated MgO powdered material and a resin. With respect to the resin used, there is no particular limitation, and examples include thermosetting resins, such as epoxy resins, phenolic resins, polyimide resins, polyester resins, silicone resins, urea resins, melamine resins, alkyd resins, diallyl phthalate resins, and polyurethane resins, and thermoplastic resins, such as polycarbonate resins, polyphenylene sulfide resins, fluororesins, polyamide resins, polyacetal resins, polybutylene terephthalate resins, polysulfone resins, polyamideimide resins, polyether imide resins, polyarylate resins, polyether ether ketone resins, and liquid crystalline polymers. Of these, preferred are epoxy resins, silicone resins, and polyphenylene sulfide resins. In the resin, if necessary, a curing agent or a curing accelerator can be added.

Examples of epoxy resins include bisphenol A epoxy resins, novolak epoxy resins, bisphenol F epoxy resins, brominated epoxy resins, ortho-cresol novolak epoxy resins, glycidyl ester resins, glycidyl amine resins, and heterocyclic epoxy resins.

Examples of phenolic resins include novolak phenolic resins and resol phenolic resins.

Examples of silicone resins include millable silicone rubbers, condensed liquid silicone rubbers, addition liquid silicone rubbers, and UV curing silicone rubbers, and preferred are addition liquid silicone rubbers. The silicone rubber may be any of one-pack silicone rubbers and two-pack silicone rubbers, but preferred is a silicone rubber of two-silicone rubbers.

In the resin composition, in addition to the phosphorus-containing coated MgO powdered material, other fillers can be added. With respect to the filler, there is no particular limitation, and examples include fused silica and crystalline silica. If necessary, a lubricant, a flame retardant, a coloring agent, or a low stress imparting agent can be appropriately added.

The resin composition of the present invention can be used in a wide variety of fields including electric and electronic applications and automotive applications. In the electric and electronic fields, the resin composition can be used in parts for computers, cellular phone connectors, optical pickups, and power modules, and the technique for, e.g., power modules developed in the electric and electronic fields can be used in the automotive applications.

Specifically, examples of radiator using the resin composition include a radiating sheet, a radiating spacer, and a radiating grease. The radiating sheet is an electrical insulating, thermal conductive sheet for removing generated heat from heat generating electronic parts and electronic devices, and is produced by adding thermal conductive filler into a silicone rubber, and mainly used in the form of being attached to a radiating fin or metallic plate. The radiating grease is substantially similar to the radiating sheet except for the use of silicone oil instead of the silicone rubber. The radiator spacer is a silicone solid material having a thickness that fills the space between a heat generating electronic part or electronic device and a casing for an electronic appliance to directly transfer the generated heat from the heat generating electronic part or electronic device to the casing.

Next, the method for producing a phosphorus-containing coated MgO powdered material of the present invention is described. In the method of the present invention, first, a coated MgO powdered material having a coating layer comprised of a double oxide on the surface is prepared. An MgO powdered material is fused at a high temperature in a state such that a compound forming a double oxide is present on the surface of the MgO powdered material to form a spherical coated MgO powdered material, thus preparing a coated MgO powdered material having a coating layer comprised of a double oxide on the surface. As an example of a method for letting a compound forming a double oxide be present on the surface of the MgO powdered material, there can be mentioned a method in which the compound is wet-added to the MgO powdered material and then they are mixed together by stirring. Alternatively, a coated MgO powdered material can be prepared by calcining an MgO powdered material in a state such that a compound forming a double oxide is present on the surface of the MgO powdered material at a temperature equal to or lower than the melting point of the coating material.

It is preferred that the compound used for forming a double oxide is at least one compound selected from the group consisting of an aluminum compound, an iron compound, a silicon compound, and a titanium compound. The form of the compound is not limited, but a nitrate, a sulfate, a chloride, an oxynitrate, an oxysulfate, an oxychloride, a hydroxide, or an oxide is used. Specific examples of the compounds include fumed silica, aluminum nitrate, and iron nitrate.

The amount of the compound added into the MgO powdered material is preferably determined so that the coated MgO powdered material finally obtained has a double oxide content of 5 to 50% by mass, more preferably 10 to 20% by mass, based on the mass of MgO.

With respect to the purity of the MgO powdered material, there is no particular limitation, and it is preferred that the purity of the MgO powdered material is determined depending on the use. For example, for satisfying the insulating properties of electronic parts, the purity is preferably 90% by mass or higher, more preferably 95% by mass or higher. The MgO powdered material having the properties in the present invention can be produced using a known method, such as an electrofusion method or a sintering method.

Next, the thus obtained double oxide-coated MgO powdered material is subjected to surface treatment with a phosphorus compound to form a coating layer comprised of a magnesium phosphate compound on the surface of the coated MgO powdered material.

Examples of phosphorus compounds used on the surface treatment include phosphoric acid, phosphoric acid salts, and acid phosphates, and these phosphorus compounds may be used individually or two or more of them may be used at the same time. Examples of phosphoric acid salts include sodium phosphate, potassium phosphate, and ammonium phosphate. Examples of acid phosphates include isopropyl acid phosphate (PAP), methyl acid phosphate, ethyl acid phosphate, propyl acid phosphate, butyl acid phosphate, lauryl acid phosphate, stearyl acid phosphate, 2-ethylhexyl acid phosphate, and oleyl acid phosphate. Of these, preferred is PAP since, in the heat treatment in the surface treatment step described below, PAP is easily reacted with MgO to form a coating layer having excellent water resistance comprised of a magnesium phosphate compound and PAP has the smaller number of carbon atoms and hence causes less organic residue during the calcination.

With respect to the amount of the phosphorus compound added in the surface treatment step, from the viewpoint of improving the water resistance of the magnesium phosphate compound coating layer formed on the surface of the coated MgO powdered material, the phosphorus compound is added so that the content of the magnesium phosphate compound in the coated MgO powdered material is preferably in the range of from 0.1 to 10% by mass, more preferably 0.2 to 5% by mass, further preferably 0.2 to 3% by mass, in terms of phosphorus.

In the method of the present invention, the surface treatment with a phosphorus compound is performed by adding a predetermined amount of a phosphorus compound to the coated MgO powdered material and stirring the resultant mixture for, e.g., 5 to 60 minutes, and then calcining it at a temperature of 300° C. or higher for 0.5 to 5 hours. When the calcination temperature is too low, for example, PAP used as the phosphorus compound causes organic residue, thus forming a coating layer comprised of a magnesium phosphate compound becomes difficult. On the other hand, when the calcination temperature is too high, performance of water resistance of the resultant coating layer lowers. The calcination temperature is preferably 300 to 900° C., more preferably 500 to 700° C.

In the calcination step for the surface treatment, the phosphorus compound attached to the surface of the coated MgO powdered material is reacted with MgO particularly present in the region of the surface of the MgO powdered material in which the double oxide coating layer is not formed or the double oxide coating layer is very sparse, thus forming a coating layer having excellent water resistance comprised of a magnesium phosphate compound.

There is a synergy between the water resistance of the coating layer comprised of the magnesium phosphate compound and that of the coating layer comprised of the double oxide in the coated MgO powdered material, which can improve the MgO powdered material in water resistance, as compared to an MgO powdered material having only a double oxide coating layer. Furthermore, the resin composition containing this phosphorus-containing coated MgO powdered material can be drastically improved in water resistance, and hence is very advantageously used in forming various radiator.

EXAMPLES

The present invention will be described in more detail with reference to the following Examples, which should not be construed as limiting the scope of the present invention.

1. Phosphorus-Containing Coated MgO Powdered Material

Synthesis Example 1

MgO powder comprising an aggregate of single crystals having a crystallite size of $58.3 \times 10^{-9}$ m (KMAO-H; manufactured by Tateho Chemical Industries Co., Ltd.) was ground using an impact grinder into a particle size of $100 \times 10^{-6}$ m or less. Fumed silica (purity: 99.9% by mass or higher; specific surface area: $200 \pm 20$ m$^2$/g) in an amount of 10% by mass based on the mass of MgO was wet-added to the resultant powder, and they were mixed by stirring at 400 to 500 rpm for 10 minutes. After the mixing by stirring, the mixture was subjected to filtration and dehydration, and the resultant cake was dried overnight using a dryer at 130° C. The dried cake was milled by means of a sample mill so that the resultant powdered material had a particle size equivalent to that of the raw material MgO powder, obtaining an MgO powdered material having silica on the surface. The powdered material obtained was subjected to melting and sphere-forming treatment by putting it in a high-temperature flame formed by combustion of LPG and oxygen to obtain a forsterite ($Mg_2SiO_4$)-coated spherical MgO powdered material.

Synthesis Example 2

A forsterite ($Mg_2SiO_4$)-coated MgO powdered material was obtained in substantially the same manner as in Synthesis Example 1 except that, instead of the melting and sphere-forming treatment, calcination was conducted in air at 1,400° C. for one hour, and then the resultant product was milled again by means of a sample mill so that the resultant powdered material had a particle size equivalent to that of the raw material MgO powder.

Example 1

The powdered material prepared in Synthesis Example 2 was placed in a Henschel mixer, and PAP was added in an amount of 5% by mass based on the mass of the powdered material, and the resultant mixture was stirred for 10 minutes, and then calcined at 500° C. for one hour to obtain a PAP-treated, coated MgO powdered material. An X-ray diffraction pattern of the powdered material obtained was measured by powder X-ray diffractometry. As a result, it was found that the coating layer comprised of a magnesium phosphate compound had a formulation of $Mg_2P_2O_7$. Further, the powdered material was subjected to water resistance test in accordance with the method shown below, and the results are shown in Table 1.

Water Resistance Test

Ig-loss (A) of a sample was first measured. Then, a closed container containing 5 g of the sample and 100 ml of water was kept in a dryer at a predetermined temperature for a predetermined period of time, and then Ig-loss (B) of the sample was measured. An increase of Ig-loss ($\Delta$Ig-loss=B−A) was determined by making a calculation. The temperature and the time were 95° C. and 120 hours.

Examples 2 to 4

Phosphorus-containing coated MgO powdered materials were individually prepared in substantially the same manner as in Example 1 except that the amount of the PAP added was changed, and each powdered material was subjected to the same water resistance test, and the results are shown in Table 1.

Examples 5 to 8 and Comparative Example 1

Phosphorus-containing coated MgO powdered materials were individually prepared in substantially the same manner as in Example 1 except that the temperature of the calcination conducted after adding PAP was changed, and each powdered material was subjected to the same water resistance test, and the results are shown in Table 1.

Example 9

A PAP-treated spherical coated MgO powdered material was obtained in substantially the same manner as in Example 1 except that the powdered material prepared in Synthesis Example 1 was used, and the powdered material was subjected to the same water resistance test, and the results are shown in Table 1.

Examples 10 to 12

Coated MgO powdered materials were individually obtained in substantially the same manner as in Example 1 except that the phosphorus compound added was changed to 2-ethylhexyl acid phosphate (JP508; manufactured by Johoku Chemical Co., Ltd.), oleyl acid phosphate (JP5180; manufactured by Johoku Chemical Co., Ltd.), or phosphoric acid, and each powdered material was subjected to the same water resistance test, and the results are shown in Table 1.

Comparative Example 2

The coated spherical MgO powdered material prepared in Synthesis Example 1, which was not treated with a phosphorus compound, was subjected to water resistance test in the same manner as in Example 1, and the results are shown in Table 1.

Comparative Example 3

The coated MgO powdered material prepared in Synthesis Example 2, which was not treated with a phosphorus compound, was subjected to water resistance test in the same manner as in Example 1, and the results are shown in Table 1.

Comparative Example 4

MgO powder comprising an aggregate of single crystals having a crystallite size of $58.3 \times 10^{-9}$ m (KMAO-H; manufactured by Tateho Chemical Industries Co., Ltd.) was ground using an impact grinder into a particle size of $100 \times 10^{-6}$ m or less. The resultant MgO powder was placed in a Henschel mixer, and PAP was added in an amount of 5% by mass, and the resultant mixture was stirred for 10 minutes, and then calcined at 500° C. for one hour to obtain a PAP-treated MgO powdered material. The powdered material obtained was evaluated in respect of water resistance in the same manner as in Example 1, and the results are shown in Table 1.

Comparative Example 5

MgO powder comprising an aggregate of single crystals having a crystallite size of $58.3 \times 10^{-9}$ m (KMAO-H; manufactured by Tateho Chemical Industries Co., Ltd.) was ground using an impact grinder into a particle size of $100 \times 10^{-6}$ m or less. The resultant MgO powder was placed in a Henschel mixer, and oleyl acid phosphate (JP5180; manufactured by Johoku Chemical Co., Ltd.) was added in an amount of 1% by mass, and the resultant mixture was stirred for 10 minutes, and then dried at 120° C. to obtain an oleyl acid phosphate-treated MgO powdered material. The powdered material obtained was evaluated in respect of water resistance in the same manner as in Example 1, and the results are shown in Table 1.

pound achieve excellent water resistance of the phosphorus-containing coated MgO powdered material of the present invention.

4) As seen in Table 1, an advantageous range of the increase of Ig-loss in the water resistance evaluation test for the phosphorus-containing coated MgO powdered material of the present invention is 10% by mass or less, preferably 5% by mass or less.

TABLE 1

| | Phosphorus-containing MgO powdered material | | | | | | |
|---|---|---|---|---|---|---|---|
| | | | | | Production method | | Water resistance |
| | Double oxide | Magnesium phosphate compound formulation | Phosphorus content (% by mass) | Phosphorus compound | Added amount (% by mass) | Calcination temperature (° C.) | evaluation test 95° C. × 120 hrs (% by mass) |
| Example 1 | $Mg_2SiO_4$ | $Mg_2P_2O_7$ | 0.86 | PAP | 5 | 500 | 0.77 |
| Example 2 | $Mg_2SiO_4$ | $Mg_2P_2O_7$ | 0.17 | PAP | 1 | 500 | 9.55 |
| Example 3 | $Mg_2SiO_4$ | $Mg_2P_2O_7$ | 0.51 | PAP | 3 | 500 | 2.00 |
| Example 4 | $Mg_2SiO_4$ | $Mg_2P_2O_7$ | 1.65 | PAP | 10 | 500 | 2.25 |
| Example 5 | $Mg_2SiO_4$ | $Mg_2P_2O_7$ | 0.86 | PAP | 5 | 400 | 1.02 |
| Example 6 | $Mg_2SiO_4$ | $Mg_2P_2O_7$ | 0.80 | PAP | 5 | 300 | 1.96 |
| Example 7 | $Mg_2SiO_4$ | $Mg_2P_2O_7$ | 0.87 | PAP | 5 | 600 | 1.62 |
| Example 8 | $Mg_2SiO_4$ | $Mg_2P_2O_7$ | 0.85 | PAP | 5 | 700 | 9.75 |
| Example 9 | $Mg_2SiO_4$ | $Mg_2P_2O_7$ | 0.84 | PAP | 5 | 500 | 0.88 |
| Example 10 | $Mg_2SiO_4$ | $Mg_2P_2O_7$ | 0.83 | JP508 | 7.5 | 500 | 0.82 |
| Example 11 | $Mg_2SiO_4$ | $Mg_2P_2O_7$ | 0.84 | JP518O | 13.5 | 500 | 0.78 |
| Example 12 | $Mg_2SiO_4$ | $Mg_2P_2O_7$ | 1.16 | $H_3PO_4$ | 5 | 500 | 1.42 |
| Comparative Example 1 | $Mg_2SiO_4$ | — | 0.83 | PAP | 5 | 120 | 19.63 |
| Comparative Example 2 | $Mg_2SiO_4$ | — | — | — | — | — | 16.31 |
| Comparative Example 3 | $Mg_2SiO_4$ | — | — | — | — | — | 24.95 |
| Comparative Example 4 | — | $Mg_2P_2O_7$ | 0.85 | PAP | 5 | 500 | 28.72 |
| Comparative Example 5 | — | — | 0.07 | JP518O | 1 | 120 | 14.00 |

From the above results, the following findings are obtained.

1) The double oxide MgO powdered material coated with a magnesium phosphate compound of the present invention (Examples 1 to 12) has excellent water resistance, as compared to the double oxide MgO powdered material which is not coated with a magnesium phosphate compound (Comparative Examples 2 and 3), and is remarkably improved in water resistance in a severe environment at 95° C. for 120 hours.

2) When the temperature of the calcination conducted after the treatment with PAP is lower than 300° C. (Comparative Example 1), a coating layer having excellent water resistance is not formed, so that the MgO powdered material has a lowered water resistance.

3) When the MgO powdered material having no double oxide layer formed thereon is treated with a phosphorus compound and then calcined at 300° C. or higher (Comparative Example 4), a coating layer comprised of a magnesium phosphate compound is formed on the surface of the MgO powdered material, but the resultant powdered material has an extremely low water resistance. Furthermore, when the same MgO powdered material having no double oxide layer formed thereon is treated with a phosphorus compound and then calcined at a temperature as low as 120° C. (Comparative Example 5), a magnesium phosphate compound is not formed on the surface of the MgO powdered material, and the resultant powdered material has a low water resistance. These results have confirmed that the synergies gained from the double oxide layer in the coated MgO powdered material and the coating layer comprised of a magnesium phosphate compound achieve excellent water resistance of the phosphorus-containing coated MgO powdered material of the present invention.

As described above in detail, the phosphorus-containing coated MgO powdered material of the present invention is obtained by subjecting the coated MgO powdered material to surface treatment with a phosphorus compound and then calcining it at 300° C. or higher, and therefore it has a coating layer comprised of a magnesium phosphate compound formed on its surface and hence has very excellent water resistance. Further, the resin composition obtained by incorporating the phosphorus-containing coated MgO powdered material into a resin and the radiator comprised of a shaped article produced from the resin composition individually have excellent water resistance and meet the strict requirements of water resistance demanded in recent years, and hence are extremely valuable in various fields of engineering plastics and others from a commercial point of view.

The invention claimed is:

1. A phosphorus-containing coated magnesium oxide powdered material comprising a coated magnesium oxide powdered material having a surface coating layer comprised of a double oxide, the phosphorus-containing coated magnesium oxide powdered material having a coating layer comprised of a magnesium phosphate compound in at least a part of a surface of the coated magnesium oxide powdered material, wherein the content of the magnesium phosphate compound in the coated magnesium oxide powdered material is 0.1 to 10% by mass, in terms of phosphorus.

2. The phosphorus-containing coated magnesium oxide powdered material according to claim 1, wherein the magnesium phosphate compound is represented by $Mg_xP_yO_z$ (wherein x=1 to 3, y=2, and z=6 to 8).

3. The phosphorus-containing coated magnesium oxide powdered material according to claim 1, wherein the double oxide comprises at least one element selected from a group consisting of aluminum, iron, silicon, and titanium, and magnesium.

4. A resin composition comprising the phosphorus-containing coated magnesium oxide powdered material according to claim 1 and a resin.

5. The resin composition according to claim 4, wherein the resin is a thermosetting resin.

6. The resin composition according to claim 5, wherein the thermosetting resin is a phenolic resin, an urea resin, a melamine resin, an alkyd resin, a polyester resin, an epoxy resin, a diallyl phthalate resin, a polyurethane resin, or a silicone resin.

7. The resin composition according to claim 4, wherein the resin is a thermoplastic resin.

8. The resin composition according to claim 7, wherein the thermoplastic resin is a polyamide resin, a polyacetal resin, a polycarbonate resin, a polybutylene terephthalate resin, a polysulfone resin, a polyamideimide resin, a polyether imide resin, a polyarylate resin, a polyphenylene sulfide resin, a polyether ether ketone resin, a fluororesin, or a liquid crystalline polymer.

9. A radiator using the resin composition according to claim 4.

10. A method for producing a phosphorus-containing coated magnesium oxide powdered material, the method comprising treating a coated magnesium oxide powdered material having a surface coating layer comprised of a double oxide with a phosphorus compound, and then calcining the resultant powdered material at 300° C. or 25 higher to form a magnesium phosphate compound on at least a part of a surface of the coated magnesium oxide powdered material.

11. The method according to claim 10, wherein the phosphorus compound is at least one compound selected from a group consisting of phosphoric acid, a phosphoric acid salt, and an acid phosphate.

12. The method according to claim 11, wherein the acid phosphate is at least one ester selected from a group consisting of isopropyl acid phosphate, 2-ethylhexyl acid phosphate, oleyl acid phosphate, methyl acid phosphate, ethyl acid phosphate, propyl acid phosphate, butyl acid 5 phosphate, lauryl acid phosphate, and stearyl acid phosphate.

13. The method according to claim 10, wherein the phosphorus compound is added so that the content of the magnesium phosphate compound in the coated magnesium oxide powdered material is 0.1 to 10% by mass, in terms of phosphorus.

* * * * *